(12) United States Patent
Jones et al.

(10) Patent No.: US 6,731,009 B1
(45) Date of Patent: *May 4, 2004

(54) MULTI-DIE ASSEMBLY

(75) Inventors: Christopher W. Jones, Pleasanton, CA (US); Brenor Brophy, San Jose, CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/528,564

(22) Filed: Mar. 20, 2000

(51) Int. Cl.[7] .................. H01L 23/48; H01L 23/52; H01L 23/50
(52) U.S. Cl. .................. 257/777; 257/686; 257/723; 257/738; 257/780; 257/778
(58) Field of Search .................. 257/777, 778, 257/780, 686, 738, 723; 361/717–721, 735, 736

(56) References Cited

U.S. PATENT DOCUMENTS

| | | | | |
|---|---|---|---|---|
| 5,291,062 A | * | 3/1994 | Higgins, III | 257/698 |
| 5,550,403 A | * | 8/1996 | Carichner | 257/702 |
| 5,646,828 A | * | 7/1997 | Degani et al. | 361/715 |
| 5,760,478 A | * | 6/1998 | Bozso et al. | 257/777 |
| 5,963,429 A | * | 10/1999 | Chen | 361/764 |
| 5,973,392 A | * | 10/1999 | Senba et al. | 257/686 |
| 6,343,019 B1 | * | 1/2002 | Jiang et al. | 361/761 |

FOREIGN PATENT DOCUMENTS

| | | | | |
|---|---|---|---|---|
| JP | 358092230 | * | 6/1983 | 21/60 |
| JP | 359127856 | * | 7/1984 | 25/4 |

OTHER PUBLICATIONS

"Stepped Pyramid Chip Stack", IBM Research Disclosure, No. 41388, pp. 1234–1236, Aug. 1998.*

* cited by examiner

Primary Examiner—Eddie Lee
Assistant Examiner—Nitin Parekh
(74) Attorney, Agent, or Firm—Bradley T. Sako

(57) ABSTRACT

A multi-chip integrated circuit assembly including embodiments having a plurality of integrated circuits connected thereto. According to one embodiment, a multi-chip assembly (100) may include a first surface (102) having first surface connections (106) and a second surface (104) having second surface connections (108). A first surface (102) may be lower than a second surface (104). First and/or second surface connections (106 and 108) may have conductive paths to one another and/or to assembly connections (110). In one particular arrangement, first and second surface connections (106 and 108) may provide "flip-chip" type connections to integrated circuits. Assembly connections (110) may provide a ball grid array (BGA) type connection for the multi-chip assembly (100).

15 Claims, 9 Drawing Sheets

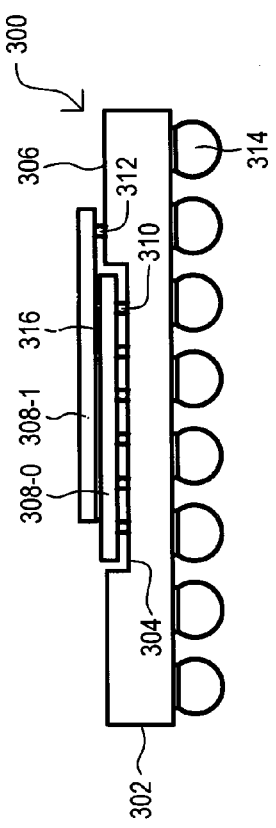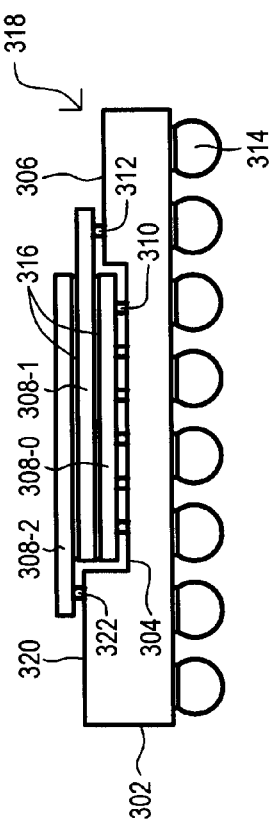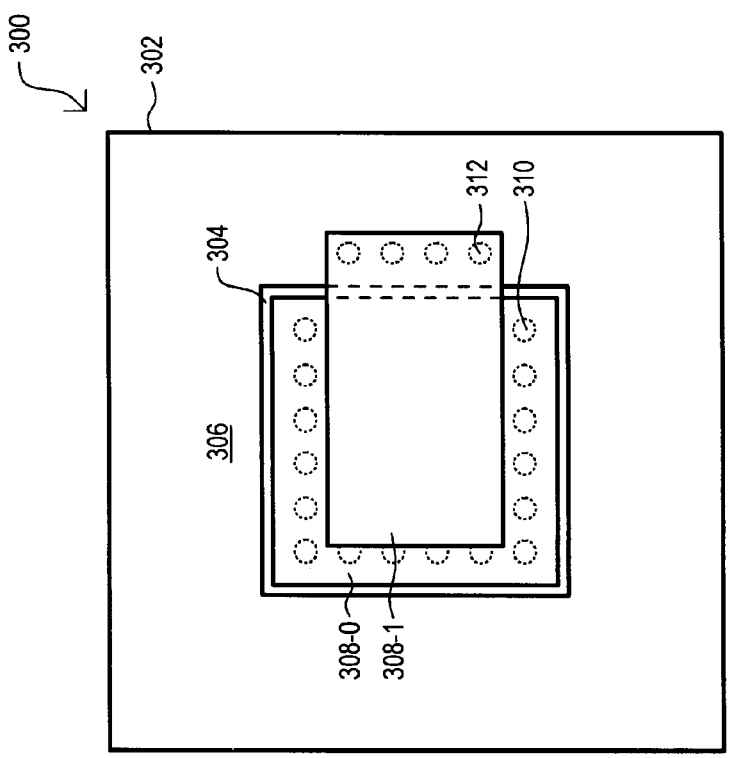

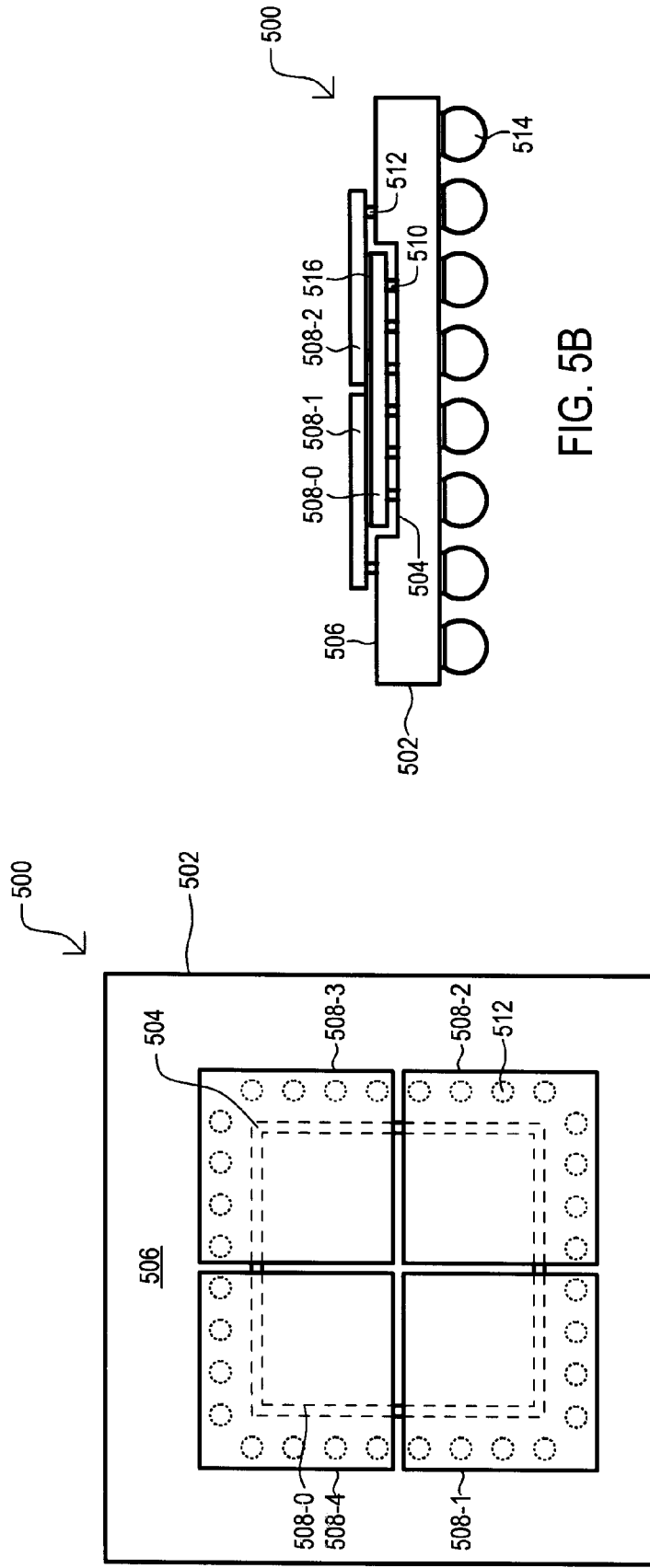

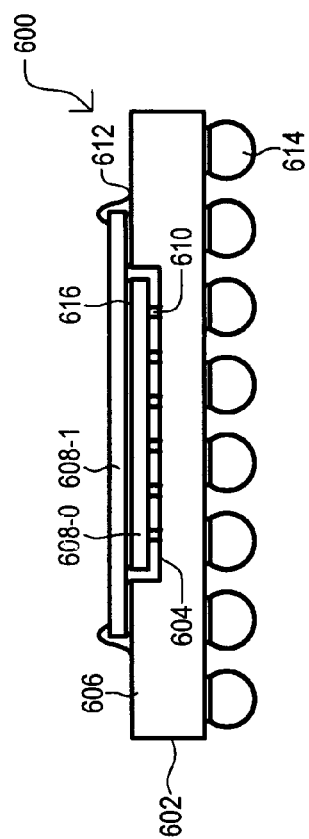
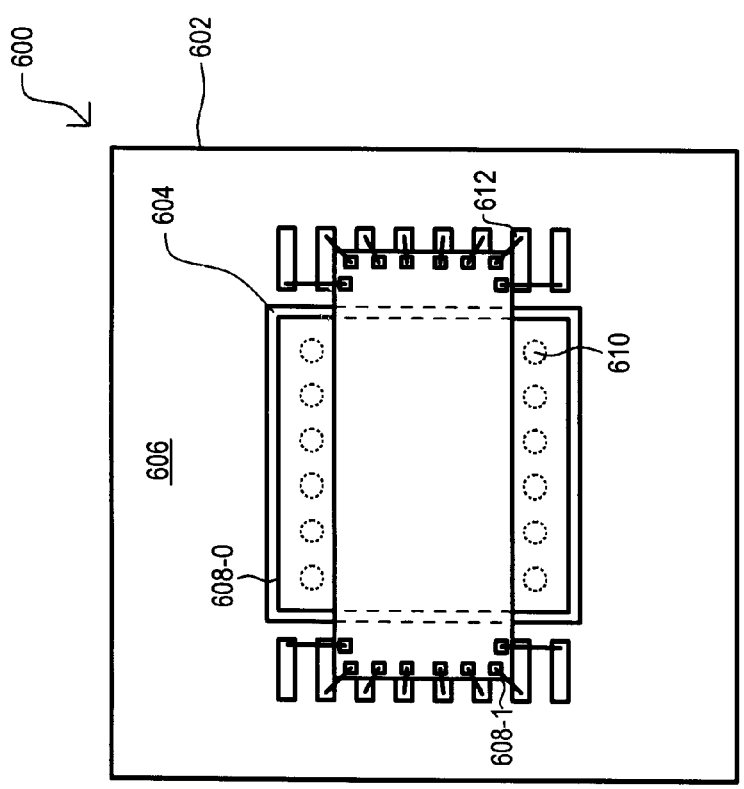
FIG. 6B
FIG. 6A

MULTI-DIE ASSEMBLY

TECHNICAL FIELD

The present invention relates generally to integrated circuit assemblies, and more particularly to assemblies that include one or more integrated circuit dice.

BACKGROUND OF THE INVENTION

Integrated circuits are typically provided in some type of assembly package. The assembly can protect an integrated circuit from mechanical and/or environmental damage. As electronic devices continue to shrink in size, it can become increasingly desirable to provide packaged integrated circuits that occupy as small an area as possible on a circuit board or the like (have as small a "footprint" as possible).

In most assemblies, conductive paths to an integrated circuit are provided by way of a chip carrier (interposer) that includes a number of "leads." The various leads of an integrated circuit can be then be connected to each other on a circuit board by traces. For some applications, the impedance presented by such traces can limit signal propagation speeds, require undesirably high drive current, and/or consume more power than desired. Along these same lines, many types of packages, due to bond wires and/or traces, may introduce unwanted inductance along a signal path. Such inductance can lead to "ground bounce" (unwanted fluctuations in a ground potential when current flows through a signal path) or other undesirable results.

It can also be desirable to provide as many circuit functions as possible in the same assembly. However, integrating multiple types of circuits within a single semiconductor substrate can be prohibitively expensive and/or add complexity to a manufacturing process.

One way to address the above concerns is to provide assemblies that include more than one integrated circuit device ("chip or die"). A number of conventional multi-chip assemblies will now be described.

FIGS. 8A and 8B show a first conventional multi-chip assembly 800. FIG. 8A shows a top plan view of a multi-chip assembly 800. A multi-chip assembly may be a ball grid array (BGA) assembly that includes multiple dice 802-0 to 802-2 situated side-by-side on an assembly substrate 804. Each die (802-0 to 802-2) may be connected to a substrate 804 by a conventional wire bond arrangement. An exemplary bond wire is indicated by the reference character 806, and may connect a bond pad on a die (802-0 to 802-2) to a conductive trace (not shown in FIG. 8A) on a substrate 804.

Various conductive traces on substrate 804 may connect various dice (802-0 to 802-2) to one another. Substrate traces may also provide a conductive path to solder balls (not shown in FIG. 8A) formed on a bottom of a substrate 804.

FIG. 8B shows a side cross-sectional view of an assembly 800. One end of a bond wire 806 can be connected to a bond pad 808 on a die 802-0. Another end of bond wire 806 can be connected to trace 810 on substrate 804. A die 802-0 can be connected to a substrate 804 by a die attach 812. As noted above, a trace 810 may provide a conductive path to solder balls 814 situated on an assembly bottom. Solder balls 814 may provide a BGA type connection for the multi-chip assembly 800.

A multi-chip approach such as that set forth in FIG. 8A and 8B can provide multiple functions without having to form a larger integrated circuit. Such an approach may also provide some reduction in the footprint presented by the various chips (802-0 to 802-2) as traces formed on a substrate 804 may be shorter than traces of a circuit board. Shorter traces on a substrate 804 may require less current to drive and present smaller impedance than conventional circuit board traces.

A second conventional approach is shown in FIGS. 9A and 9B. FIG. 9A is a top plan view of a multi-chip assembly 900 according to another conventional example. A multi-chip assembly 900, like the example of FIGS. 8A and 8B, can include dice 902-0 to 902-2 arranged in a side-by-side fashion. Unlike the example of FIGS. 8A and 8B, dice 902-0 to 902-2 may be connected to a substrate 904 by conductive bumps (e.g., in a "flip-chip" fashion). In a flip-chip arrangement, a die can include a bonding surface that faces an assembly substrate 904. A number of connections can be provided between a bonding surface and traces in a substrate 904 by conductive structures such as bumps, or the like. Conductive connections between dice (902-0 to 902-2) and a substrate 904 are shown as dashed circles. One of the many connections is shown as item 906. Like the arrangement of FIGS. 8A and 8B, various conductive traces (not shown) on a substrate 904 may connect various dice (902-0 to 902-2) to one another, and to solder balls (not shown in FIG. 9A) formed on a bottom of a multi-chip assembly 900.

FIG. 9B shows a side cross-sectional view of an assembly 900. A number of conductive connections 906 may exist between a die 902-0 and an assembly substrate 904. Solder balls 908 may provide a BGA type connection for a multi-chip assembly 900.

As in the case of the example of FIGS. 8A and 8B, a multi-chip approach such as that set forth in FIG. 9A and 9B can provide multiple functions. A multi-chip assembly 900 may also have a smaller footprint than a multi-chip assembly 800, as bond wire connections may require more area around the periphery of dice 802-0 to 802-2 than flip-chip type connections.

A drawback to the arrangements of FIGS. 8A, 8B, 9A and 9B is that an assembly footprint may be no smaller than the combined area of the dice contained within the assembly.

A third conventional example is shown in FIG. 10. FIG. 10 shows a side cross-sectional view of multi-chip assembly 1000. A multi-chip assembly 1000 may include dice 1002-0 and 1002-1 that are stacked one on top of the other. Die 1002-0 can be situated on an assembly substrate 1004, while die 1002-1 can be situated on die 1002-0. Lower bond wires, one of which is shown as item 1006, can connect die 1002-0 to traces on a substrate 1004. Higher bond wires, one of which is shown as 1008, can connect die 1002-1 to traces on a substrate 1004. Higher bond wires 1008 can extend over lower bond wires 1006. Like the previously described examples, traces (not shown) on a substrate 1004 may connect dice 1002-0 to 1002-1 to one another and/or to solder balls 1010 formed on a bottom of a substrate 1004.

A multi-chip packaging arrangement such as that shown in FIG. 10 can provide multiple functions without having to form a larger integrated circuit. Such a multi-chip assembly 1000 can also provide a smaller footprint than the previously described examples, as the dice (1002-0 and 1002-1) may be stacked on top of one another, and not arranged in a side-by-side fashion. Traces on substrate 1004 can present smaller impedance than circuit board traces.

A drawback to the arrangement of FIG. 10 arises out of a ratio between the sizes of the dice in the assembly. In particular, a top die may have to be smaller than a bottom die to allow bonding from a substrate to a bottom die. Further, a substrate may have to include sufficient area to allow upper bond wires to be formed over lower bond wires.

Yet another conventional example of a multi-chip assembly is shown in FIG. 11 in a cross-sectional view. A multi-chip assembly 1100 may include multiple dice (1102-0 to 1102-2) having traces that extend from bond locations on a die surface to a die edge. Vertical traces may connect traces on dice edges to one another, and to solder balls 1104 on a bottom of an assembly 1100. Connections may include gold traces insulated by a dielectric such as polyimide. In addition, or alternatively, connections may be made by "flex tape" which can include a flexible insulating tape having conductive traces formed within.

A multi-chip packaging arrangement such as that shown in FIG. 11 can provide multiple functions, and a comparatively small footprint with respect to the other described conventional examples. Traces formed by polyimide-gold and/or flex tape connections may present smaller impedance than circuit board traces. In addition, unlike multi-chip assembly 1000, multi-chip assembly 1100 may not be subject to die size ratios, as in the case of assembly 1000 of FIG. 10.

Other variations on a stacked arrangement, such as that of FIG. 11, may include attaching a number of dice in a row to a flex tape having chip carrier structures. A stacked chip arrangement can then be created by folding such a flex tape in an accordion like fashion.

A drawback to stacked die assemblies, such as that shown in FIG. 11, can be the complexity and costs involved in forming such an assembly.

It would be desirable to arrive at some way of forming a multi-chip assembly that provides a small footprint relative to conventional approaches, but that does not suffer from the complexity and/or the cost of conventional stacked die assemblies.

SUMMARY OF THE INVENTION

The present invention may include an assembly for multiple integrated circuits in die form. An assembly may include a substrate having a recessed portion and a raised portion. An assembly may further include a first die having a plurality of conductive connections to a recessed portion. In addition, at least a second die can have a portion that overlaps a first die. A second die may also include a plurality of conductive connections to a raised portion of a substrate.

According to one aspect of the embodiments, a recessed portion of a substrate may be surrounded by a raised portion of a substrate to form a cavity that can contain a first die.

According to another aspect of the embodiments, a first die may have a flip-chip type connection to a recessed portion of a substrate.

According to another aspect of the embodiments, a second die that overlaps a first die may have a flip-chip type connection to a raised portion of a substrate.

According to another aspect of the embodiments, a second die that overlaps a first die may have a wire bond connection to a raised portion of a substrate.

According to another aspect of the embodiments, a first die can have a plurality of conductive connections to a recessed portion while a number of other dice may overlap a first die. Such other multiple dice may have a plurality of conductive connections to a raised portion of a substrate.

According to another aspect of the embodiments, a first die may have a connection to traces on a recessed portion of a substrate. Traces on a recessed portion can provide a conductive path to traces on a raised portion of a substrate. In addition, or alternatively, traces on a substrate may provide a conductive path to assembly connections. Assembly connections include solder balls, pins, and/or conductive leads, as but a few examples.

BRIEF DESCRIPTION OF THE DRAWINGS

FIGS. 3A, 3B, and 3C are a top plan view and side cross-sectional views of a third embodiment.

FIGS. 5A and 5B are a top plan view and a side cross-sectional view of a fifth embodiment.

FIGS. 6A and 6B are a top plan view and a side cross-sectional view of a sixth embodiment.

DETAILED DESCRIPTION OF THE EMBODIMENTS

Various embodiments will now be described in conjunction with a number of diagrams. The embodiments set forth various multi-chip assemblies that include small footprints relative to other conventional approaches without necessarily incurring the complexity and costs of conventional stacked die assemblies.

Figure 1:
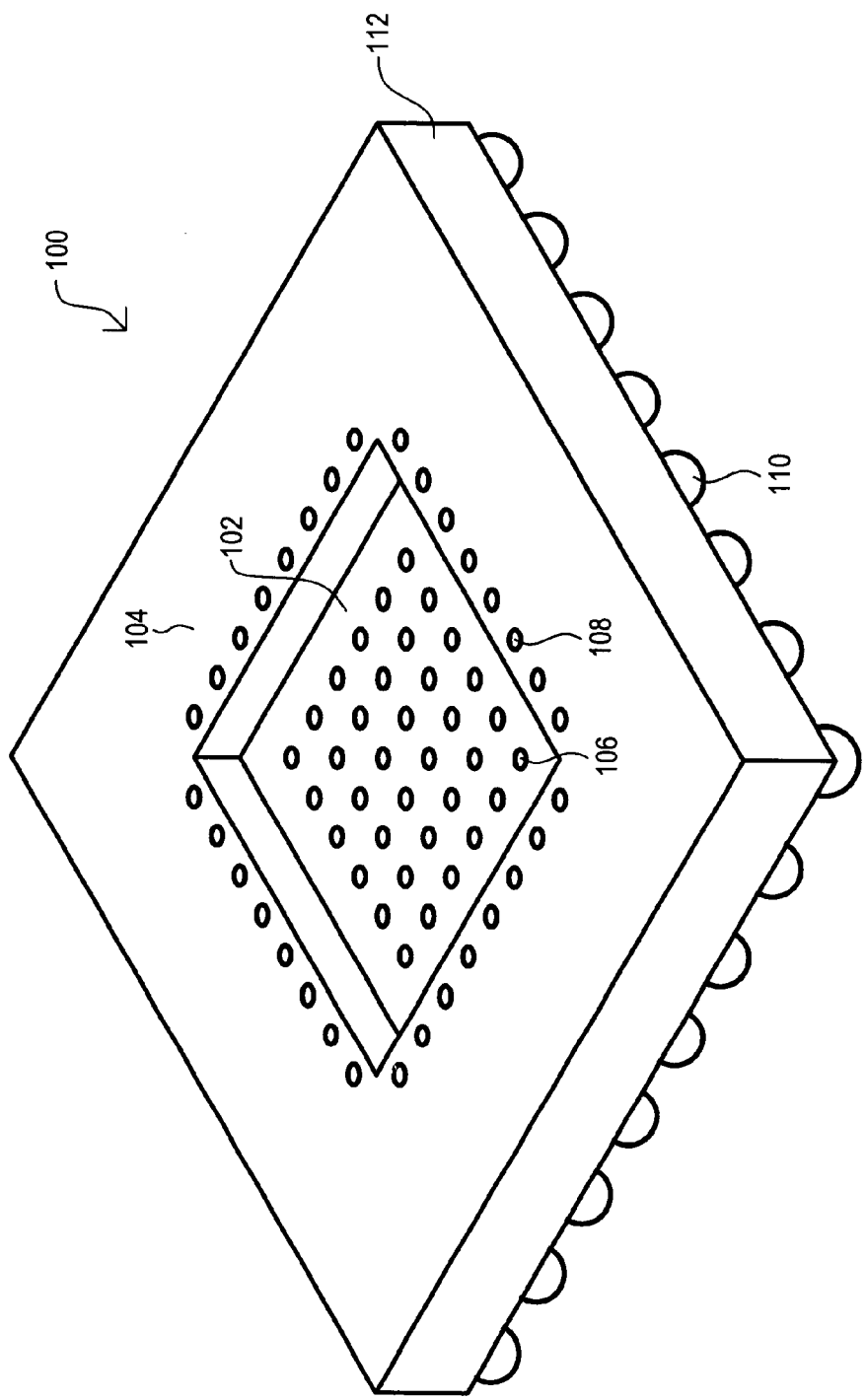
FIG. 1 is an isometric view of a first embodiment.

FIG. 1 sets forth a multi-chip assembly 100 according to one embodiment. A multi-chip assembly 100 may include a first surface 102 and a second surface 104. A first surface 102 may be situated lower than a second surface 104 and include a number of first surface connections, one of which is shown as 106. A second surface 104 may include a number of second surface connections, one of which is shown as 108. A multi-chip assembly 100 may also include a number of assembly connections, one of which is shown as item 110.

A first surface connection 106 may provide a conductive path to an assembly connection 110, to a second surface connection 108, or both. Similarly, a second surface connection 108 may provide a conductive path to an assembly connection 110, to a first surface connection 106, or both.

In the particular example of FIG. 1, first surface connections 106 may include conductive "bumps" for providing a "flip-chip" type connection to an integrated circuit. Similarly, second surface connections 108 may also include conductive "bumps" for providing a "flip-chip" type connection to an integrated circuit.

The particular example of FIG. 1 may also include a "ball grid array" (BGA) type assembly, with assembly connections 110 including solder balls. One skilled in the art would recognize that conductive connections between assembly connections 110, first surface connections 106, and second surface connections 108 may take a variety forms. As but one example, a first surface 102 and second surface 104 may be portions of a common substrate 112. A substrate 112 may include internal conductive layers connected to one another by vertical conductive vias. In addition or alternatively, first and/or second surface connections (106 and/or 108) may be connected to assembly connections 110 by traces that wrap around outer edges of a substrate 112 or through vertical holes extending through a substrate 112.

Figure 2:
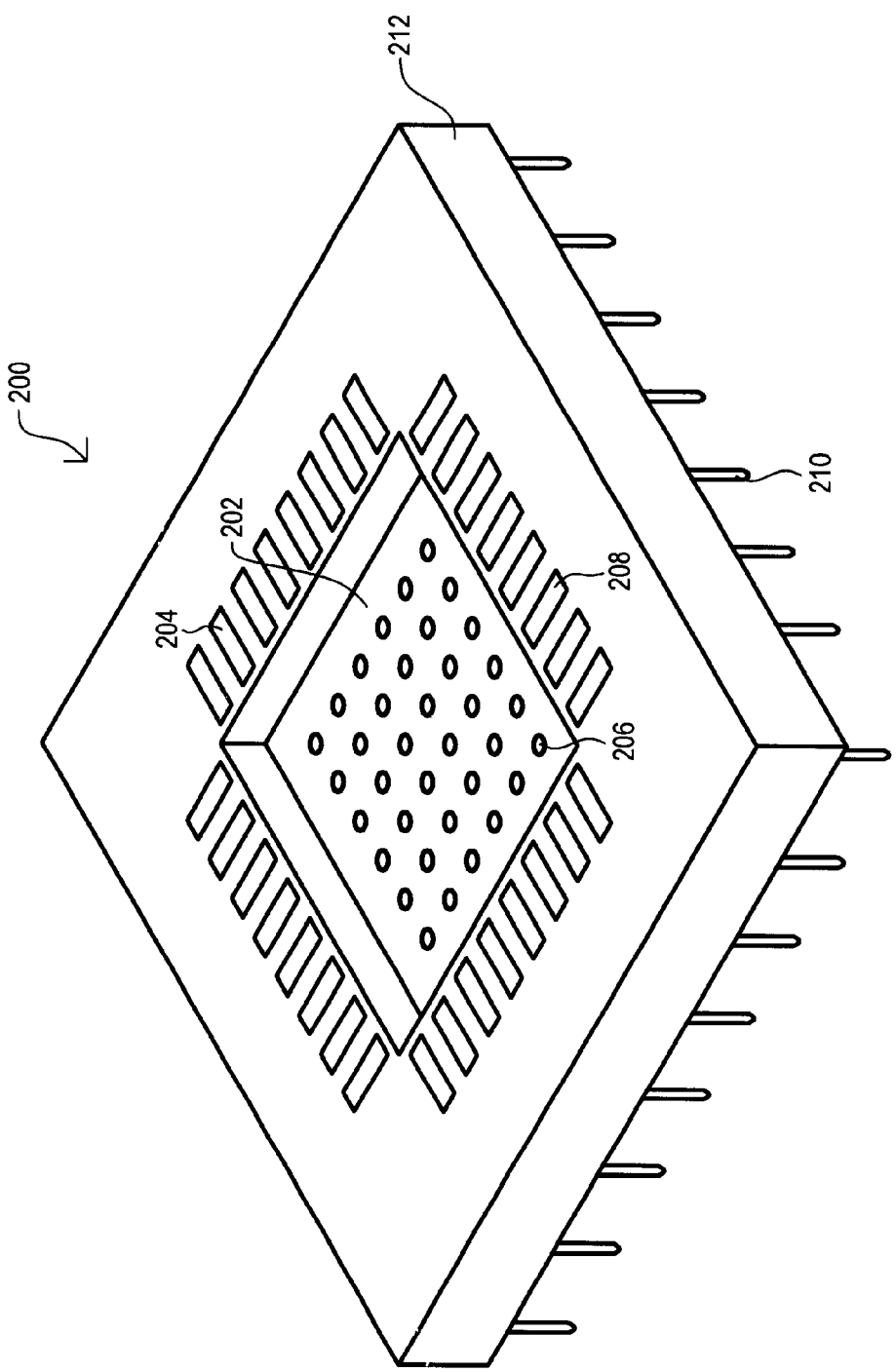
FIG. 2 is an isometric view of a second embodiment.

Of course, the particular features of a first embodiment 100 should not be construed as limiting the invention thereto. FIG. 2 shows a second embodiment 200. A second embodiment 200 can include some of the same general constituents as a first embodiment 100. To that extent, like constituents will be referred to by the same reference character but with the first digit being a "2" instead of a "1."

A second embodiment 200 can illustrate second surface connections 208 that provide bond wire landings instead of flip-chip type connections. Further, assembly connections 210 of a second embodiment 200 can be pin-type connections instead of solder balls.

According to various embodiments, a multi-chip assembly may further include at least two integrated circuits in die form. One die can be connected to first surface connections while a second die can overlap a first die, and be connected to second surface connections. A first example of such a die containing assembly is shown as a third embodiment in FIGS. 3A, 3B and 3C. FIG. 3A shows a top plan view of a multi-chip assembly 300. FIG. 3B is a side cross-sectional view of a multi-chip assembly 300. FIG. 3C is a side cross-sectional view of another multi-chip assembly 318.

A multi-chip assembly 300 according to a third embodiment may include a substrate 302 having a lower substrate portion 304 and an upper substrate portion 306. A first die 308-0 may be situated over, and connected to, a lower substrate portion 304. In addition, at least a second die 308-1 may be situated over a first die 308-0 and be connected to an upper substrate portion 306.

In the particular arrangements of FIGS. 3A to 3C a first die 308-0 can be connected to a lower substrate portion 304 by a number of lower substrate connections, one of which is shown as 310. As but one example, lower substrate connections 310 may include a number of conductive bumps for a flip-chip type arrangement. A second die 308-1 may be connected to an upper substrate portion 306 by a number of upper substrate connections, one of which is shown as 312. Upper substrate connections 312, like lower substrate connections 310, may include a number of conductive bumps to form a flip-chip type arrangement.

A multi-chip assembly 300 may also include assembly connections 314. Assembly connections 314 may have conductive paths to a first die 308-0 by way of lower substrate connections 310 and/or to a second die 308-1 by way of upper substrate connections 312. In addition, a substrate 302 may include conductive paths between lower substrate connections 310 and upper substrate connections 312.

A second die 308-1 may be attached to a first die 308-0 by a supporting material 316. A supporting material 316 may include polyimide, as but one example.

As shown in the embodiments of FIGS. 3A to 3C, an upper substrate portion 306 may surround a lower substrate portion 304 forming a cavity that includes a lower substrate portion 304. A first die 308-0 may be situated within such a cavity.

FIG. 3C illustrates how multiple dice can continue to be stacked according to a first embodiment. FIG. 3C shows a side-cross sectional view of an assembly 318 that may include a third die 308-2 situated over a first and a second die (308-0 and 308-1). A third die 308-2 may be connected to a second upper substrate portion 320 by a number of second upper substrate connections, one of which is shown as 322. In one particular arrangement, second upper substrate connections 322, like substrate connections 310 and 312, may include a number of conductive bumps to form a flip-chip type arrangement.

In this way, a third embodiment 300 or 318 may provide a compact footprint by including one or more dice that overlap one another. Further, because a first die 308-0 can be connected to a lower substrate portion 304, there may be fewer constraints on die sizes and ratios of die sizes, as is the case of conventional approaches, where a top die may have to be smaller than a bottom die.

Figure 4B:
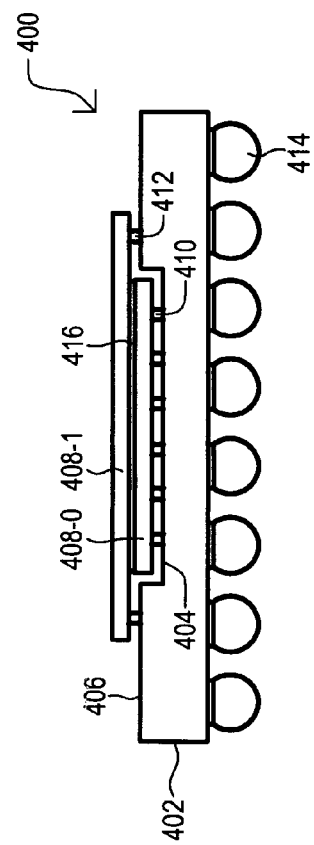
FIGS. 4A and 4B are a top plan view and a side cross-sectional view of a fourth embodiment.
Figure 4A:
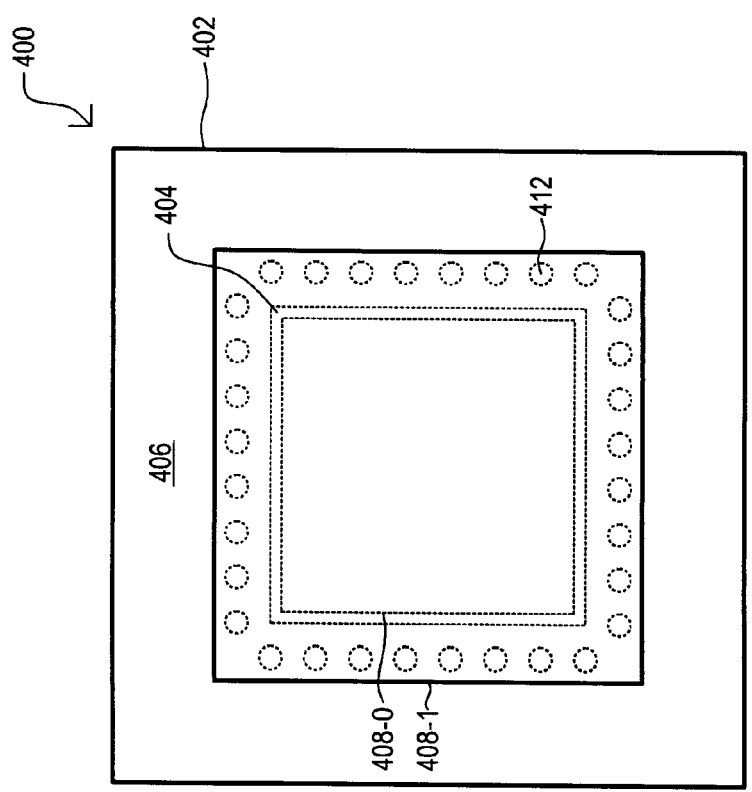

Another example of a die containing assembly is shown as a fourth embodiment in FIGS. 4A and 4B. FIG. 4A shows a top plan view of a multi-chip assembly 400. FIG. 4B is a side cross-sectional view of a multi-chip assembly 400. A fourth embodiment 400 may include similar constituents to those of a third embodiment 300. To that extent like constituents are referred to by the same reference character but with the first digit being a "4" instead of a "3."

A fourth embodiment 400 can differ from that of FIGS. 3A to 3C in that a second die 408-1 can overlap all edges of a first die 408-0. In the particular arrangement of FIGS. 4A and 4B, a first die 408-0 may be situated within a cavity that can be surrounded by upper substrate connections 412. A second die 408-1 may be connected to surrounding upper substrate connections 412.

Figure 10:
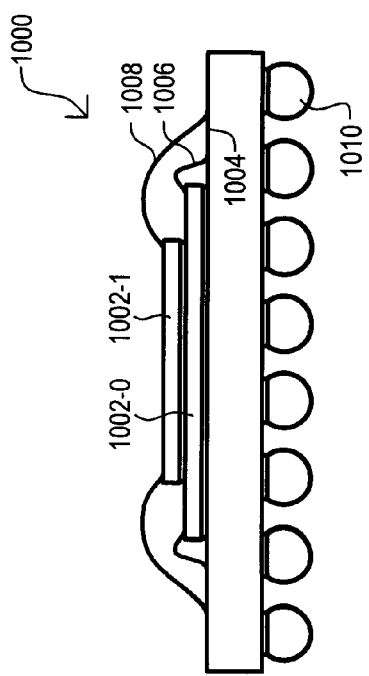
FIG. 10 is a side cross-sectional view of a third conventional multi-chip assembly.

In this way, a fourth embodiment 400 may also provide a compact footprint by including one die that overlaps another. Further, because both a first die 308-0 and second die 308-1 are connected by a flip-chip arrangement, there may be fewer die size constraints than conventional bond wire arrangements, such as that shown in FIG. 10. In particular, a top die does not necessarily have to be smaller than a bottom die to ensure that sufficient bonding area remains exposed on a bottom die.

Yet another example of a die containing assembly is shown as a fifth embodiment in FIGS. 5A and 5B. FIG. 5A shows a top plan view of a multi-chip assembly 500. FIG. 5B is a side cross-sectional view of a multi-chip assembly 500. A fifth embodiment 500 may include similar constituents to those of a third embodiment 300. To that extent like constituents are referred to by the same reference character but with the first digit being a "5" instead of a "3."

A fifth embodiment 500 can differ from that of FIGS. 3A to 3C in that more than one die can directly overlap a first die 508-0. In the particular arrangement of FIGS. 5A and 5B, a second die 508-1, third die 508-2, fourth die 508-3 and fifth die 508-4 can overlap a first die 508-0. Second through fifth dice (508-1 to 508-4) can be connected to an upper substrate portion 506 by upper substrate connections 512.

Figure 11:
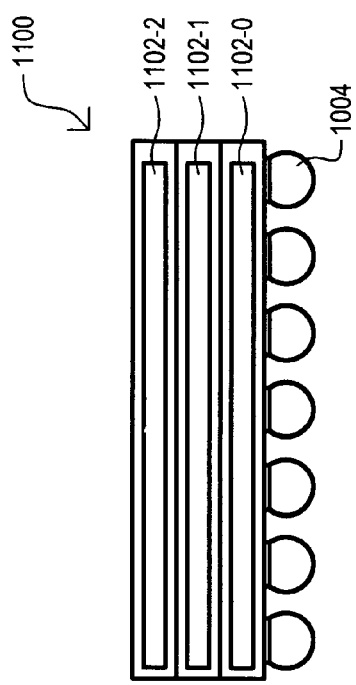
FIG. 11 is a side cross-sectional view of a fourth conventional multi-chip assembly.

In this way, a fifth embodiment 500 may also provide a compact footprint by including multiple dice that overlap a lower die. Such an arrangement may not incur the complexity and cost of a conventional stacked multi-chip arrangement, such as that shown in FIG. 11.

A further example of a die containing assembly is shown as a sixth embodiment in FIGS. 6A and 6B. FIG. 6A shows a top plan view of a multi-chip assembly 600. FIG. 6B is a side cross-sectional view of a multi-chip assembly 600. A sixth embodiment 600 may include similar constituents to those of the third embodiment 300. To that extent like constituents are referred to by the same reference character but with the first digit being a "6" instead of a "3."

A sixth embodiment 600 can differ from that of FIGS. 3A to 3C in that a second die 608-1 may be connected to an upper substrate portion 606 in a different fashion than the manner by which a first die 608-0 may be connected to a lower substrate portion 604. In the particular arrangement of FIGS. 6A and 6B, a first die 608-0 can be connected to a lower substrate portion 604 by flip-chip lower substrate connections 610. A second die 608-1 may be connected to an upper substrate portion 606 by bond wires.

In this way, a sixth embodiment 600 may provide a compact footprint by including one die that overlaps another, but that may also include a die that is connected to a substrate by a conventional bond wire arrangement. This may reduce complexity and cost over conventional stacked dice packages. It is noted that a supporting material 616 may be a conductive die attach material that can allow a common substrate potential between a first die 608-0 and second die 608-1.

Figure 7:
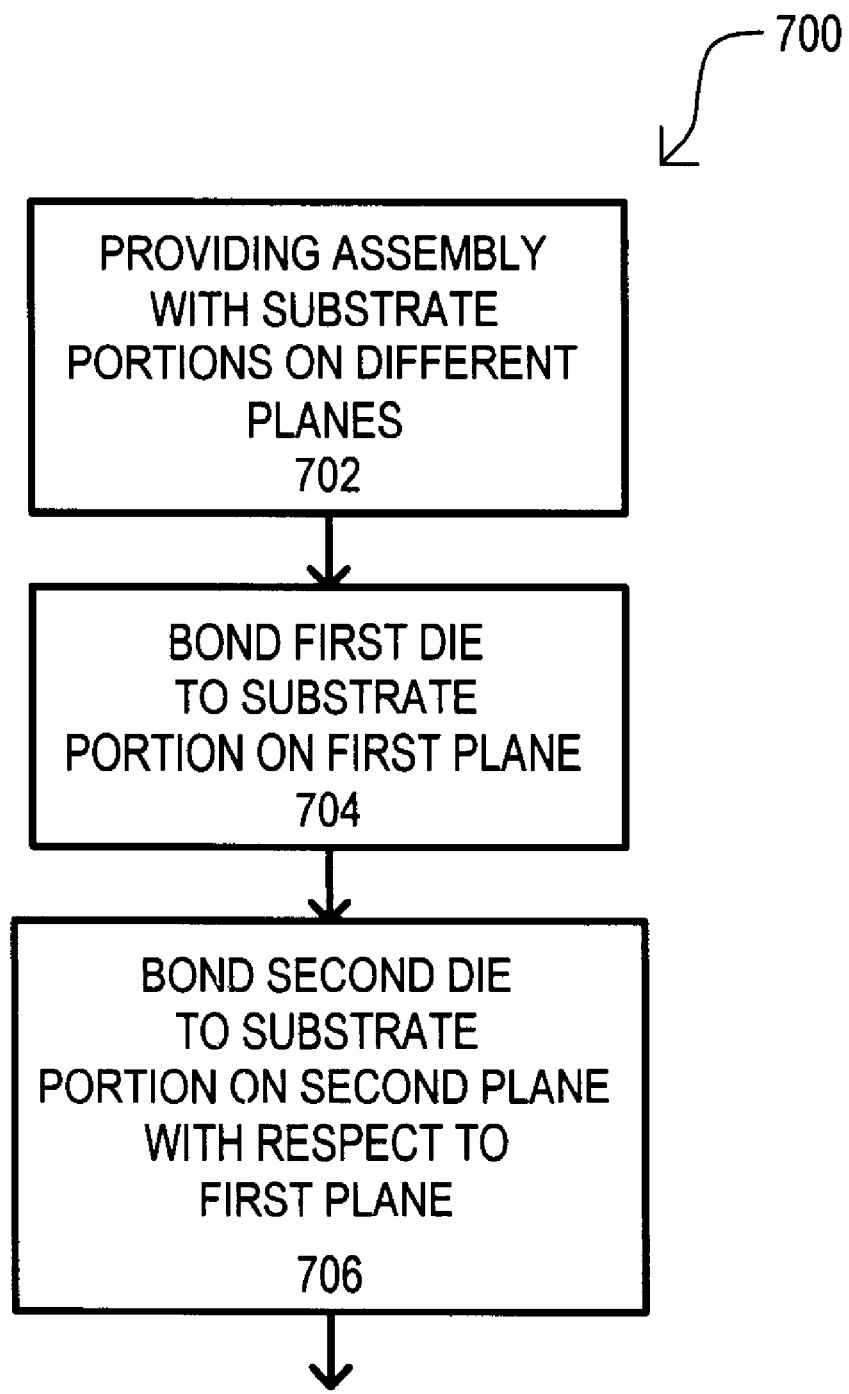
FIG. 7 is a diagram illustrating a method according to one embodiment.
Figure 9A:
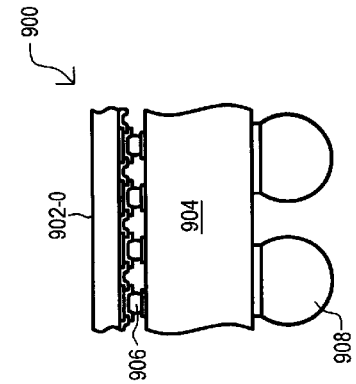
FIGS. 9A and 9B are a top plan view and a side cross-sectional view of a second conventional multi-chip assembly.
Figure 9B:
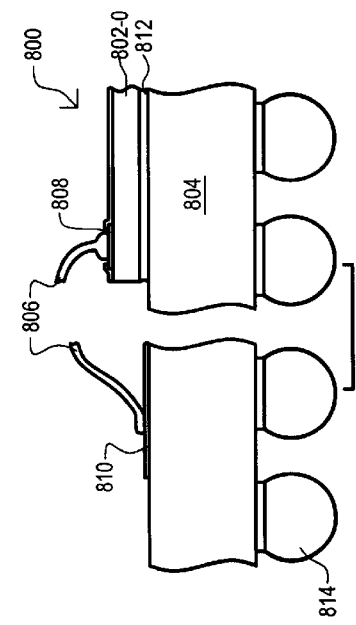
Figure 8A:
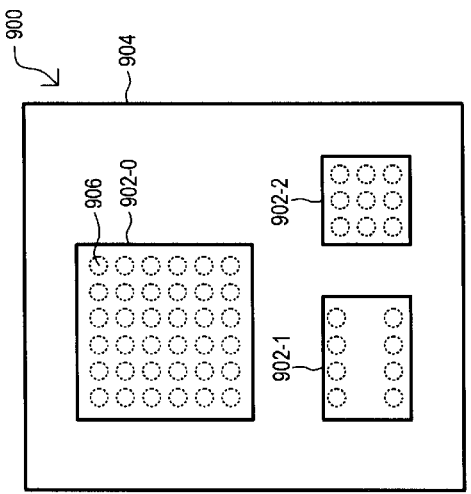
FIGS. 8A and 8B are a top plan view and a side cross-sectional view of a first conventional multi-chip assembly.
Figure 8B:
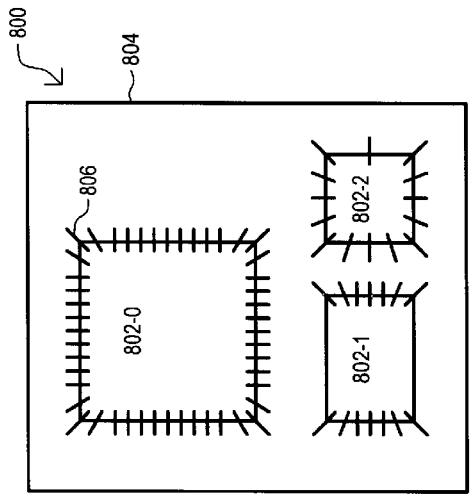

Having described various assembly structures, a method of assembling integrated circuits according to one embodiment will now be described. A method is shown in FIG. 7, designated by the general reference character 700.

A method 700 may include providing an assembly with a substrate having portions on different planes (step 702). In one particular arrangement, each portion of a substrate can include associated conductive connections. Such conductive connections may provide a way to connect an integrated circuit to a substrate. Connection types may include, as but two examples, flip-chip and/or wire bond connections.

A method 700 may further include bonding a first die to a substrate portion on a first plane (step 704). In particular arrangement, a step 704 may include flip-chip bonding a first die, face down, to a recessed portion of a substrate. Bonding may include thermal steps for softening conductive bumps and/or mechanical steps for bringing conductive portion of a die in contact with conductive connections in a substrate. These are but two of the many possible examples.

A method 700 may further include bonding a second die to a substrate portion on a second plane, with a second die being positioned over a first die (step 706). In particular arrangements, such a step may include flip-chip bonding a second die in the same general fashion as described above in conjunction with a first die. Other bonding steps may be employed however. As but one example, a second die may be wire bonded to a substrate.

A step 706 may also include forming a protective and/or attaching layer over a first die prior to bonding a second die to a substrate. Such a layer may include an insulating material, such as polyimide as but one example, in the event isolation is desired between a first die and an overlying second die. In addition, or alternatively, such a layer may include a conductive die attach material in the event conductivity is desired between a first die and a second die.

It is understood that while various embodiments have been described, the present invention can be subject to additional variations. As but a few of the many possible variations, bonding arrangements, such as that shown in FIGS. 6A and 6B, may include centrally located bonding wires. In addition, or alternatively, a conductive frame may extend from, or be a portion of, an upper substrate portion. A second die may be connected to such a "lead over chip" by way of bond wires and/or conductive bump connections.

Further, while various embodiments have illustrated an upper substrate portion that surrounds a lower substrate portion to form a cavity, an upper substrate portion could surround only a portion of a lower substrate portion. Along these same lines, while assemblies having lower and upper substrate portions have been described, more than three substrate portions at different levels may be included.

Assembly materials may also vary. A substrate may include a layered material, such as a ceramic material having conductive layers formed within. However, other various packaging options are possible. A substrate may be a plastic assembly (e.g., an epoxy resin) that surrounds a die-carrying frame. Such a frame can include lower and upper substrate portions that do not necessarily have to be contiguous with one another. Multiple dice may be attached to such a frame by bump-type (flip-chip) bonding and/or wire bonding, for example. All or a portion of the assembling procedure can include tape automated bonding.

While embodiments have presented assemblies with solder ball and pin connections, other assembly connections are possible. As but one of the many possible examples, an assembly may include a solder "column" type arrangement.

The various embodiments may further include a protective cover over dice contained within. Such protective covers may include epoxy resin, polyimide, and/or a metallic lid (formed with copper, for example).

Thus, it is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A structure, comprising:
 a first integrated circuit die coupled to a first substrate portion by a plurality of first integrated circuit die connections;
 a second integrated circuit die, partially overlapping and extending beyond no more than two edges of the first integrated circuit die, and coupled to a second substrate portion by a plurality of second integrated circuit die connections, the second substrate portion being on a different plane than the first substrate portion; and
 a plurality of assembly connections conductively coupled to at least one of the first and second integrated circuit die connections.

2. The structure of claim 1, wherein:
 the first integrated circuit die connections comprise flip-chip connections.

3. The structure of claim 1, wherein:
 the second integrated circuit die connections comprise flip-chip connections.

4. The structure of claim 1, wherein:
 the second integrated circuit die connections comprise bond wire landings.

5. The structure of claim 1, wherein:
 the assembly connections comprise solder balls.

6. The structure of claim 1, wherein:
 the second substrate portion surrounds the first substrate portion forming a cavity that includes the first substrate portion.

7. The structure of claim 1, further including:
 a plurality of second integrated circuit dice disposed over at least a portion of the first integrated circuit die and coupled to the second integrated circuit die connections.

8. A multi-chip assembly, comprising:
 at least one second integrated circuit die disposed over, partially overlapping and extending beyond no more than two edges of a first integrated circuit die that is coupled to a first assembly substrate portion by first conductive connections, the at least one second integrated circuit die being coupled to second conductive connections in a second assembly substrate portion on a different plane than the first assembly substrate portion.

9. The multi-chip assembly of claim 8, wherein:

the assembly includes a first side comprising the first assembly substrate portion and second assembly substrate portion and an opposing second side that includes a plurality of conductive assembly connections.

10. The multi-chip assembly of claim 8, including:

a plurality of second integrated circuit dice disposed over the first integrated circuit die, each partially overlapping and extending beyond at least one edge of the first integrated circuit die.

11. The multi-chip assembly of claim 8, wherein:

the first integrated circuit die is flip-chip bonded to the first assembly substrate portion.

12. The multi-chip assembly of claim 8, wherein:

the second integrated circuit die is flip-chip bonded to the second assembly substrate portion.

13. The multi-chip assembly of claim 8, further including:

at least one third integrated circuit die disposed over and extending beyond an edge of the second integrated circuit.

14. The multi-chip assembly of claim 13, wherein:

that at least one third integrated circuit die is coupled to a third assembly substrate portion by third conductive connections, the third assembly substrate portion being on a different plane than the first and second assembly substrate portions.

15. A multi-chip assembly, comprising:

no more than two integrated circuit dice including a first integrated circuit die coupled to a first substrate portion of an assembly by first die connections; and a second integrated circuit die overlapping and extending beyond all edges of the first integrated circuit die, and coupled to a second substrate portion of the assembly by a plurality of second die connections; and a plurality of assembly connections conductively coupled to at least one of the first and second die connections on a third substrate portion of the assembly, the first, second, and third substrate portions being on different planes, at least a portion of the plurality of assembly connection being overlapped by the first integrated circuit die.

* * * * *